United States Patent [19]

Honjō et al.

[11] 3,959,817

[45] May 25, 1976

[54] SWITCHING CIRCUIT FOR CONNECTING A MAGNETIC HEAD IN A MAGNETIC RECORDING AND REPRODUCING APPARATUS

[75] Inventors: Yoshihiko Honjō, Kozagun; Seisuke Hiraguri, Yokohama, both of Japan

[73] Assignee: Victor Company of Japan, Limited, Yokohama, Japan

[22] Filed: Oct. 29, 1974

[21] Appl. No.: 518,769

[30] Foreign Application Priority Data

Nov. 15, 1973 Japan.................. 48-131218[U]
Nov. 16, 1973 Japan.................. 48-128429

[52] U.S. Cl................................. 360/62; 360/61
[51] Int. Cl.²........................................ G11B 15/12
[58] Field of Search.............................. 360/61, 62

[56] References Cited
UNITED STATES PATENTS 3,721,774   3/1973   Yonemoto et al.................. 360/61
3,810,135   5/1974   Kawakami et al.................. 360/62

*Primary Examiner*—James W. Moffitt

[57] ABSTRACT

A switching circuit connects a magnetic head in a magnetic recording and reproducing apparatus. The magnetic head is used for recording and reproducing signals onto and from a magnetic recording medium. The switching circuit comprises a first electronic switch connected between ground, the output side of a recording amplifier, and one terminal of the magnetic head. The switch becomes nonconductive during the recording mode and becomes conductive during the reproducing mode. A second electronic switch circuit is connected substantially between ground, the other terminal of the magnetic head, and the input side of a reproducing amplifier. The second switch becomes conductive during recording and nonconductive during the reproducing mode.

5 Claims, 10 Drawing Figures

SWITCHING CIRCUIT FOR CONNECTING A MAGNETIC HEAD IN A MAGNETIC RECORDING AND REPRODUCING APPARATUS

BACKGROUND OF THE INVENTION

The present invention relates generally to circuits for connecting magnetic heads in a magnetic recording and reproducing apparatus. More particularly, the invention relates to an electronic circuit which switches the connections of magnetic heads between a recording amplifier and a reproducing amplifier, at the time of recording and reproducing magnetically recorded and reproduced video signals.

In general, in a magnetic recording and reproducing apparatus for video signals, the same head records and reproduces the video signals. For this reason, it is necessary to connect the head to a recording amplifier at the time of recording and to a reproducing amplifier at the time of reproducing.

In the conventional magnetic recording and reproducing apparatus for video signals, a mechanical or relay switch changes over the connection of the magnetic head to the recording and reproducing amplifiers. When a mechanical switching device of over switch or a relay switch. when a switching device of this character is used, malfunctioning is apt to occur, thereby lowering the reliability of operation of the device. Furthermore, such a switching device presents a problem in that it requires much space for installation.

SUMMARY OF THE INVENTION

Accordingly, a general object of the present invention is to provide a novel and useful circuit for changing over connections of magnetic video heads in a magnetic recording and reproducing apparatus.

A specific object of the invention is to provide a switching circuit which uses electronic circuits for switching the connections of magnetic heads to a recording amplifier and to a reproducing amplifier, the switches comprising semiconductor elements. By this provision, the invention achieves a high reliability of switching the connections of the magnetic heads to the amplifiers and, moreover, the switching device can be made small, light and, at low cost.

Another object of the invention is to provide electronic switching circuits which prevent mutual interference when a magnetic head is switched between the recording amplifier and the reproducing amplifier.

Other objects and further features of the invention will be apparent from the following detailed description of the preferred embodiments of the invention when read in conjunction with the accompanying drawings.

DETAILED DESCRIPTION

Figure 1:
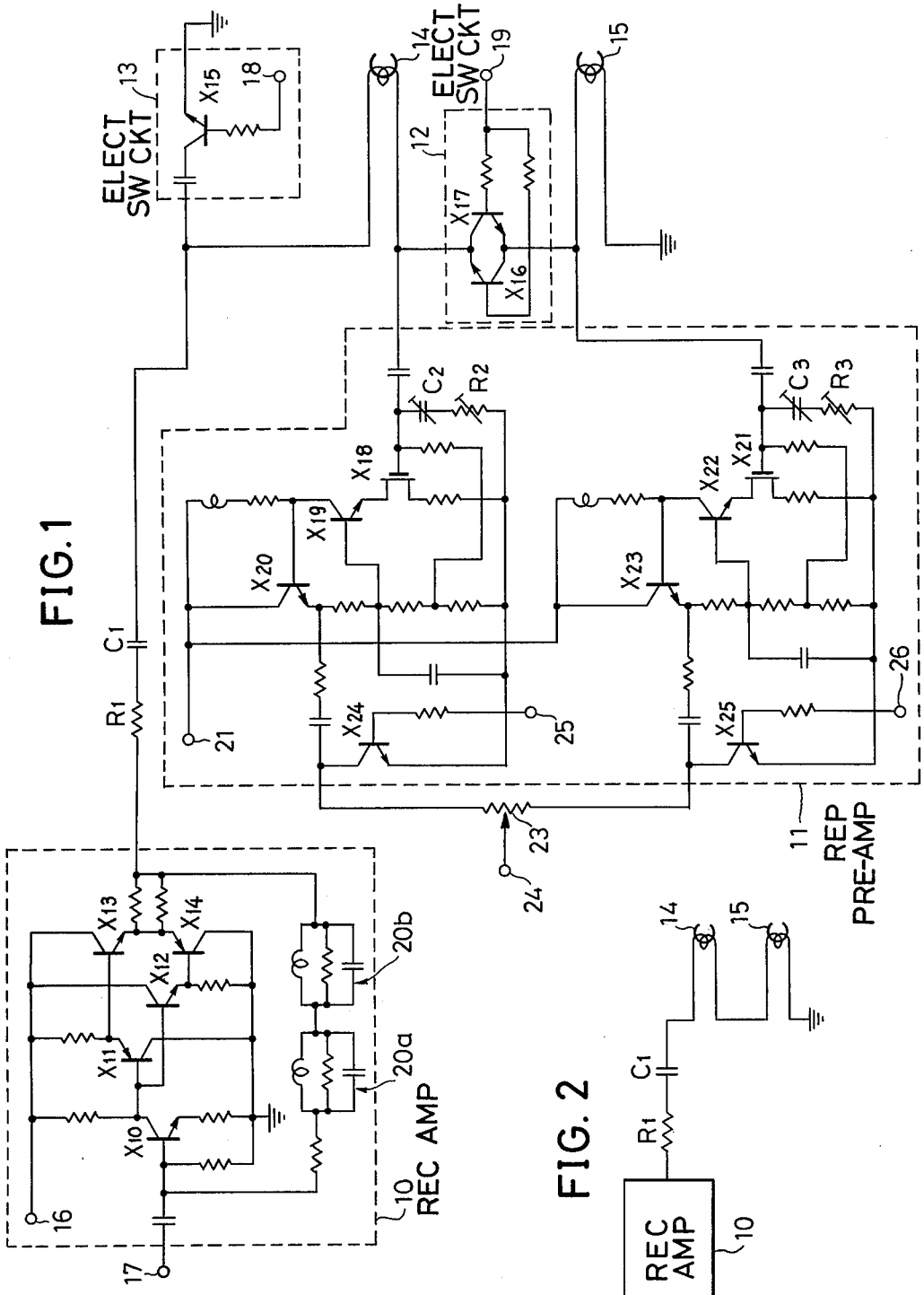
FIG. 1 is a circuit diagram of a first embodiment of a magnetic head connection switching circuit according to the invention for use in a magnetic recording and reproducing apparatus.

The first embodiment of the magnetic head switching circuit illustrated in FIG. 1 comprises, a recording amplifier 10, a reproducing pre-amplifier 11, electronic switch circuits 12 and 13, and recording and reproducing magnetic heads 14 and 15.

The output side of the recording amplifier 10 is connected by way of a resistor R1 and a capacitor C1 to one terminal of the magnetic head 14. The electronic switch circuit 13 is connected between this output side and ground (earth). The other terminal of the magnetic head 14 is connected to one part of the reproducing pre-amplifier 11 and, by way of the electronic switch circuit 12, to one terminal of the magnetic head 15. This one terminal of the magnetic head 15 is also connected to another part of the reproducing pre-amplifier 11, while the other terminal of the magnetic head 15 is grounded.

At the time of recording electric power is supplied to a power-supply terminal 16 of the recording amplifier 10, and, at the same time, a recording video signal is applied to an input terminal 17 of the same amplifier. The video signal thus applied to the terminal 17 is amplified by the recording amplifier 10 comprising transistors X10, X11, X12, X13, and X14.

Figure 2:
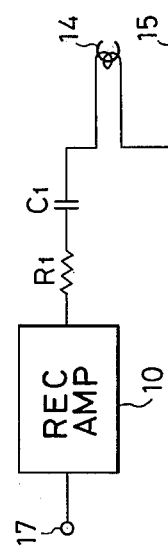
FIG. 2 is an equivalent block diagram circuit of the circuit illustrated in FIG. 1 at the time of a recording mode of operation.

At this time, no voltage is being impressed on a control terminal 18 of the electronic switch circuit 13. A transistor X15 in this circuit 13 is in its nonconductive state or OFF. On the other hand, a positive voltage is impressed on a control terminal 19 of the electronic switch circuit 12, and transistors X16 and X17 of switch circuit 12 are conductive or ON. Accordingly, the equivalent circuit of the circuit illustrated in FIG. 1, at the time of recording, is approximately as shown in FIG. 2. Consequently, the output signal of the recording amplifier 10 is supplied by way of the resistor R1 and the coupling capacitor C1 to the magnetic head 14 and, further, passing through the electronic switch circuit 12 is supplied to the magnetic head 15.

Figure 3:
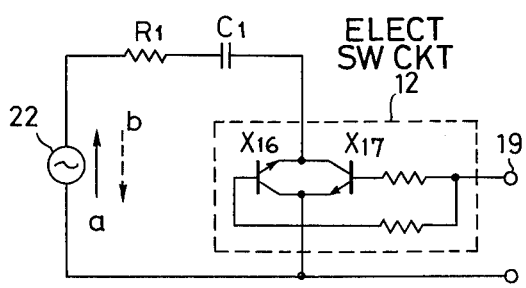
FIG. 3 is a circuit diagram descriptive of the operation of an electronic switch circuit in the circuit illustrated in FIG. 1.

The operation of the electronic switch circuit 12 will now be described in greater detail, in conjunction with FIG. 3. The emitters and collectors of the NPN transistors X16 and X17 are respectively connected together. Their junction points are respectively connected to the other terminal of the magnetic head 14 and the one terminal of the magnetic head 15. The bases of these transistors X16 and X17 are respectively connected by way of resistors to the terminal 19. As a result of the voltage impressed on the terminal 19, the transistor X17 is made conductive. A voltage having polarity in the arrow direction $a$ represents a recording signal sent from a power source 22. Thereupon, a current flows from the collector to the emitter of the transistor X1'. On the other hand, when the voltage is supplied in th arrow direction *b*, from the power source 22. Positive and negative voltages are thus impressed respectively on the collector and emitter of the transistor X16.

Since the emitter of the transistor 16 is not connected directly to ground, a base does not ordinarily flow. When this emitter assumes a negative potential, a base current flows, and the transistor X16 is switched ON and made conductive. Therefore, when a voltage is supplied in the arrow direction *b*, a current flows from the collector to the emitter of the transistor X16. The base current which flows at this time charges the capacitor C1, and the resulting charge is discharged through the transistor X17 when the polarity of the power source 22 is reversed. Thus, when a positive voltage is impressed on the control terminal 19, the electronic switch circuit 12 passes signals in the two opposite directions from the magnetic head 14 to the magnetic head 15 and vice versa, thereby passing an alternating-current signal as a resultant effect.

The magnetic heads 14 which 15 are rotating magnetic heads, for example, and record the recording video signals on a magnetic tape (not shown) alternately along tracks which are oblique relative to the tape longitudinal direction.

The reproducing pre-amplifier 11 is connected to the magnetic heads 14 and 15. Since field-effect transistors X18 and X21, having very high input impedance, are connected in the initial stage of this pre-amplifier 11, there is almost no flow of recording signal into the reproducing pre-amplifier 11. Furthermore, in the input circuit of this reproducing pre-amplifier 11, there are connected a circuit for head resonance comprising a capacitor C2 and a resistor R2 and a circuit for head resonance comprising a capacitor C3 and a resistor R3. For this reason, while the head circuits have frequency characteristics, it is possible to provide ample compensation therefor by means of equalizer circuits 20*a* and 20*b*, often provided within the recording amplifier 10.

Then, at the time of reproducing mode, the supply of power is cut off to the power-supply terminal 16 of the recording amplifier 10. Power is supplied to a power-supply terminal 21 of the reproducing pre-amplifier 11. Furthermore, the voltage impressed on the control terminal 19 of the electronic switch circuit 12 is turned off, and the transistors X16 and X17 are switched off to turn OFF the switch circuit 12. On the other hand, a positive voltage is impressed on the control terminal 18 of the electronic switch circuit 13, whereby the transistor X15 is switched on to turn ON and the electronic switch circuit 13 becomes ON.

Figure 4:
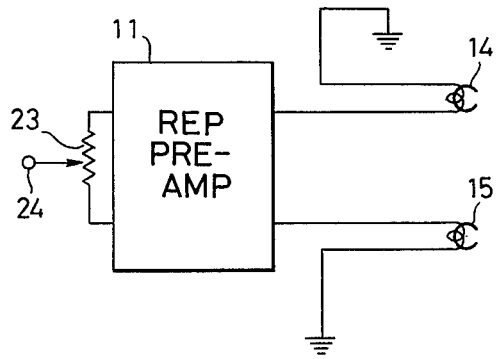
FIG. 4 is an equivalent block diagram of the circuit shown in FIG. 1 at the time of a reproducing mode of operation.

Accordingly, the reproducing mode equivalent of the circuit illustrated in FIG. 1 is approximately as indicated in FIG. 4. A signal reproduced by the magnetic head 14 is amplified by the field-effect transistor X18 and transistors X19 and X20 of the reproducing preamplifier 11. A signal reproduced by the magnetic head 15 is amplified by a field-effect transistor X21 and transistors X22 and X23 of the reproducing pre-amplifier 11. The signals, thus amplified, are led out through a variable resistor 23, and and an output terminal 24.

During this operation, the electronic switch circuit 13 is ON, and the line from the recording amplifier 10 is grounded. For this reason, the recording amplifier 10 has no effect whatsoever on the reproduced signals.

The magnetic heads 14 and 15 alternately reproduce signals form the tape. When the magnetic head 14 is reproducing, a positive voltage is impressed on only a terminal 26, and a transistor X25 (associated with head 15) becomes conductive. When the magnetic head 15 is reproducing, a positive voltage is impressed on only a terminal 25, and a transistor X24 (associated with head 14) becomes conductive. Therefore, when either of these magnetic heads alternately reproduces signals, noise from the other head is not reproduced because it is short circuited through either transistor X24 or X25, in conductive a state, and does not appear at the output terminal 24.

Figure 5:
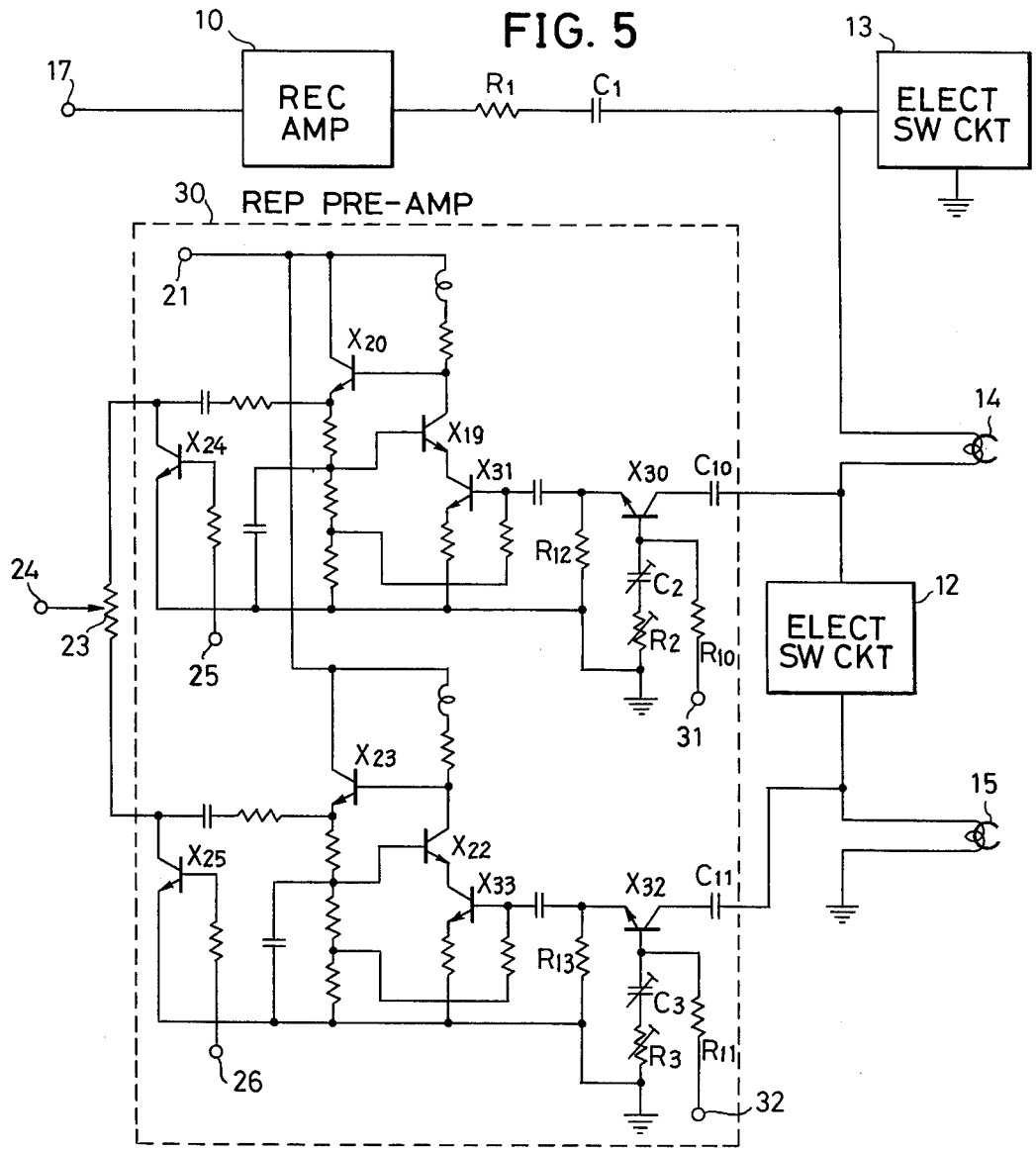
FIG. 5 is a circuit diagram of a second embodiment of the magnetic head connection switching circuit according to the invention.

Another embodiment of the magnetic head connection switching circuit, according to the present invention, will now be described with reference to FIG. 5. Those parts which are the same as corresponding parts in FIG. 1 are designated by like reference numerals and characters. Detailed description of such parts will be omitted.

In this circuit, the other terminal of the magnetic head 14 is connected by way of a transistor X30 to a transistor X31 of a reproducing pre-amplifier 30. One terminal of the magnetic head 15 is connected by way of a transistor X32 to a transistor X33 of the same reproducing pre-amplifier 30. Control terminals 31 and 32 are respectively connected through resistors R10 and R11 to the bases of the transistors X30 and X32.

At the time of recording, the electronic switch circuit 13 is OFF, and the electronic switch circuit 12 is ON, as in the preceding first embodiment. Furthermore, no power is supplied to the power supply terminal 21 of the reproducing pre-amplifier 30, or to the control terminals 31 and 32. As a consequence, the transistors X30 and X32, as a result of their diode effects, hold the voltage on the left side (as viewed in FIG. 5) of capacitors C10 and C11 at their collectors voltage, which is in the order of from 10 to 20 volts. Transistors X30 and X32 are in their nonconductive state.

Therefore, as in the first embodiment, the recording video signal amplified by the recording amplifier 10 is supplied to the magnetic heads 14 and 15. However, at this time the transistors X30 and X32 substantially cut off the magnetic heads 14 and 15 from the reproducing pre-amplifier 30. For this reason, the recording signal is not adversely affected by the reproducing pre-amplifier.

Then, at the time of reproducing, the power supply is cut off from the power supply terminal of the recording amplifier 10. Power is supplied to the power supply terminal 21 of the reproducing pre-amplifier 30. Furthermore, a positive voltage is impressed on each of the control terminals 31 and 32, and base currents are flowing through the bases of the transistors X30 and X32, whereby they switch ON and become conductive between their respective emitters and collectors. In addition, the electronic switch circuit 13 is turned ON, while the electronic switch circuit 12 switches OFF.

The signal reproduced from the magnetic head 14 passes through the capacitor 10, the transistor X30 and is amplified by transistors X31, X19, and X20, and thereafter to the output terminal 24. Here, the transistor X30 is in a conductive state since a forward bias is impressed between its base and emitter. The potential of its emitter is substantially equal to a voltage resulting from a division of the voltage impressed on the terminal 31 by way of resistors R10 and R12.

With the circuit in this state, a positive voltage is impressed on the collector of the transistor X30 a current flows through the base of transistor X30, which thereupon becomes conductive, in the direction from its collector toward its emitter. Even when a negative voltage is impressed on the collector, a voltage is applied in the forward direction, between the base and collector of the transistor X30, which thereupon becomes conductive. Furthermore, the signal reproduced from the magnetic head 15 also passes through the capacitor C11 and the transistor X32 as described above. After being amplified by the transistors X33, X22, and X23, the signal is led out through the output terminal 24.

Figure 6A:
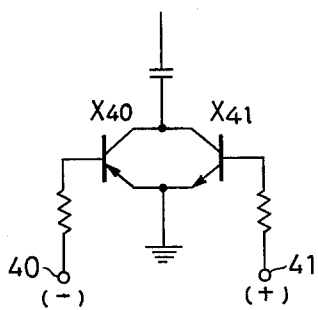
FIGS. 6A through 6D are circuit diagrams respectively showing various embodiments of electronic switching circuits which can be employed in the circuit of the invention.
Figure 6B:
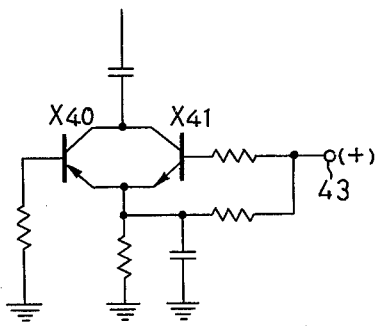
Figure 6C:
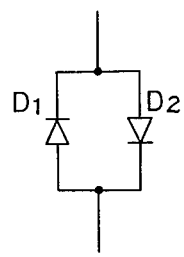

Other embodiments of the electronic switch circuits 12 and 13, in the above described two embodiments, will now be described. Other embodiments of the switch circuit 12 are illustrated in FIGS. 6A, 6B, and 6C. In the circuit shown in FIG. 6A, a PNP transistor X40 and an NPN transistor X41 are connected emitter-to-emitter and collector-to-collector. When a negative potential and a positive potential are respectively impressed through terminals 40 and 41 to the bases of the transistors X40 and X41, these transistors X40 and X41 become conductive. This electronic switch circuit becomes conductive with respect to signals moving in two directions (i.e., an alternating-current signal). This electronic switch circuit can be used also as the electronic switch circuit 13.

The circuit indicated in FIG. 6B, is so arranged that a positive voltage is impressed through a terminal 43 to the base of the transistor X41 and the commonly connected emitters of the transistors X40 and X41. The base of the transistor X40 is grounded through a resistor. By this circuit arrangement, results can be obtained which are equivalent to those of the circuit shown in FIG. 6A.

In the circuit illustrated in FIG. 6C, two diodes D1 and D2 are connected in parallel and soled in mutually opposite directions. As is known, a diode exhibits a very high impedance with respect to voltages lower than a threshold value and exhibits a very low impedance with respect to a high voltage in the forwardly biased direction. Accordingly, each diode becomes conductive with respect to a recording signal of relatively high voltage (or current) relative to the forward direction and becomes nonconductive with respect to a reproducing signal of low voltage. Therefore, this electronic switch circuit becomes conductive with respect to an alternating-current recording signal.

Figure 6D:
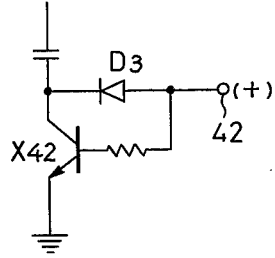

Another embodiment of the electronic switch circuit 13 is illustrated in FIG. 6D. In this circuit, a positive voltage is impressed through a terminal 42, onto the base of a transistor X42, which thereby becomes conductive. Furthermore, a positive voltage is impressed through a diode D3 onto the collector of the transistor X42. As a result of the flow of a collector current, the impedance at the time of conduction is lower than the impendance of the electronic switch circuit 13 shown in FIG. 1.

In this connection, it is to be noted that in each of the above described circuits, the PNP and NPN transistors may be interchanged respectively with NPN and PNP transistors, in which case, the polarities of the impressed voltages are changed. Furthermore, in the circuit shown in FIG. 5, electronic switch circuits, as described above, may be used instead of the transistors X30 and X32.

Figure 7:
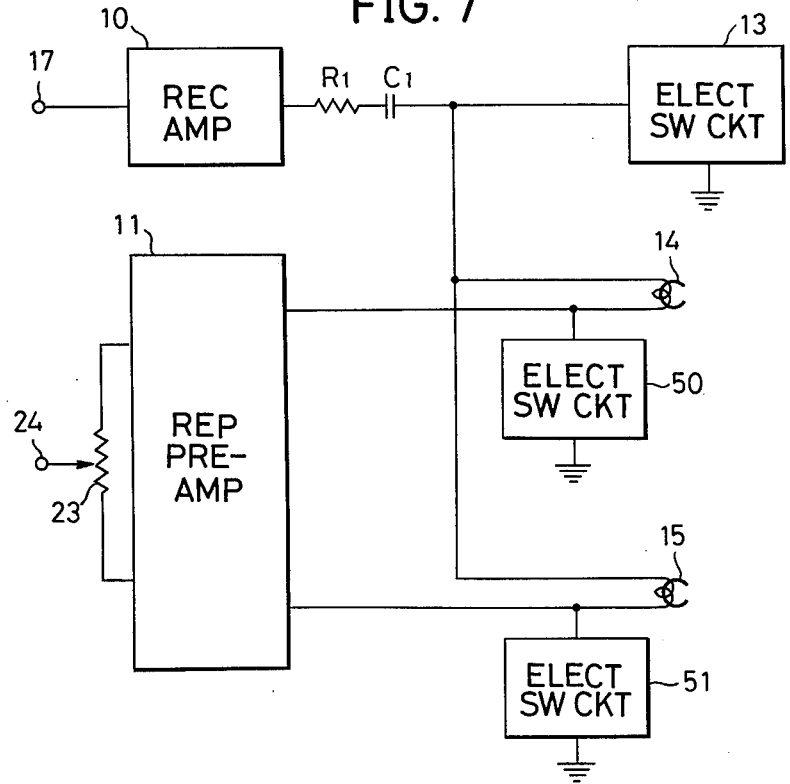
FIG. 7 is a block diagram of a third embodiment of the magnetic head connection switching circuit according to the invention.

A third embodiment of the magnetic head connection switching circuit, according to the present invention, will now be described with reference to FIG. 7, in which parts that are the same as corresponding parts in FIG. 1 are designated by like reference numerals and characters. Detailed description of such parts will not be repeated.

In the instant circuit, the output side of the recording amplifier 10 is connected by way of the resistor R1 and capacitor C1 to the electronic switch circuit 13 and, at the same time, is connected to one terminal of each of the magnetic heads 14 and 15. The other ends of the magnetic heads 14 and 15 are respectively connected to the reproducing pre-amplifier 11 and are grounded through electronic switch circuits 50 and 51, respectively. These electronic switch circuits 50 and 51 are respectively made conductive at the time of recording and nonconductive at the time of reproducing, similarly as with electronic switch circuit 12.

Further, this invention is not limited to these embodiments but various variations and modifications may be made without departing from the scope and spirit of the invention.

What is claimed is:

1. A magnetic head switching circuit for use in a magnetic recording and reproducing apparatus having at least first and second two terminal magnetic heads for recording signals on and reproducing signals from a magnetic recording medium and having recording and reproducing modes of operation, said magnetic head switching circuit comprising:

recording amplifier means having an output side connected to one of two terminals of the first magnetic head;

a two input reproducing amplifier means having one input connected to the other terminal of the first magnetic head and having the other input connected to one terminal of the second magnetic head for amplifying signals reproduced by the first and second magnetic heads respectively;

the other terminal of the second magnetic head being connected to ground;

first electronic switch means connected between said one terminal of the first magnetic head and ground;

second electronic switch means connected between said other terminal of the first magnetic head and said one terminal of the second magnetic head;

first biasing means for applying a voltage to switch on said first electronic switch means during the reproducing mode and for removing the applied voltage from said first electronic switch means to switch it off during the recording mode; and second biasing means for applying a voltage to switch on said second electronic switch means during the recording mode and for removing the applied voltage from said second electronic switch means to switch it off during the reproducing mode of operation of the apparatus.

2. The magnetic head switching circuit as claimed in claim 1 further comprising third electronic switch means connected between the other terminal of the first magnetic head and the one input of said reproducing amplifier means, fourth electronic switch means connected between the one terminal of the second magnetic head and said other input of the reproducing amplifier means, and third biasing means for applying a voltage to switch on the third and fourth electronic switch means during the reproducing mode and for removing the applied voltage from the third and fourth electronic switch to switch them off during the recording mode.

3. The magnetic head switching circuit as claimed in claim 1 wherein said second electronic switch means comprises a pair of transistors which are connected to each other, emitter-to-collector, the junction points between the emitter-to-collector connections being connected respectively to said other terminal of the first magnetic head and to said one terminal of the second magnetic head, said second biasing means applying the voltage to the base electrodes of the pair of transistors during the recording mode of operation.

4. The magnetic head switching circuit as claimed in claim 1 wherein said second electronic switch means comprises an NPN transistor and a PNP transistor which are connected together, emitter-to-emitter and collector-to-collector, junction points of said connections being connected respectively to said other terminal of the first magnetic head and to said one terminal of the second magnetic head, said second biasing means applying a positive voltage to a base electrode of the NPN transistor and applying a negative voltage to a base electrode of the PNP transistor during the recording mode of operation and removing the applied positive and negative voltages during the reproducing mode of operation.

5. The magnetic head switching circuit as claimed in claim 1 wherein said second electronic switch means comprises an NPN transistor and a PNP transistor which are connected together, emitter-to-emitter and collector-to-collector, junction points of said connections being respectively connected to said other terminal of the first magnetic head and to said one terminal of the second magnetic head, said PNP transistor having a base electrode connected to ground through a resistor, said second biasing means applying the voltage to a base electrode of said NPN transistor during the recording mode of operation.

\* \* \* \* \*